(12) United States Patent
Yoneda et al.

(10) Patent No.: US 10,892,429 B2
(45) Date of Patent: Jan. 12, 2021

(54) ORGANIC EL ELEMENT AND DISPLAY DEVICE

(71) Applicant: JOLED INC., Tokyo (JP)

(72) Inventors: Kazuhiro Yoneda, Tokyo (JP); Noriyuki Matsusue, Tokyo (JP)

(73) Assignee: JOLED INC., Tokyo (JP)

( * ) Notice: Subject to any disclaimer, the term of this patent is extended or adjusted under 35 U.S.C. 154(b) by 520 days.

(21) Appl. No.: 15/526,574

(22) PCT Filed: Nov. 17, 2015

(86) PCT No.: PCT/JP2015/005748
§ 371 (c)(1),
(2) Date: May 12, 2017

(87) PCT Pub. No.: WO2016/079985
PCT Pub. Date: May 26, 2016

(65) Prior Publication Data
US 2017/0309854 A1    Oct. 26, 2017

(30) Foreign Application Priority Data

Nov. 17, 2014 (JP) .................................. 2014-232827
Nov. 17, 2014 (JP) .................................. 2014-232875

(51) Int. Cl.
*H01L 51/00* (2006.01)
*H01L 51/50* (2006.01)
(Continued)

(52) U.S. Cl.
CPC .......... *H01L 51/5004* (2013.01); *C09K 11/06* (2013.01); *G09F 9/30* (2013.01);
(Continued)

(58) Field of Classification Search
CPC .................................................. H01L 51/5004
See application file for complete search history.

(56) References Cited

U.S. PATENT DOCUMENTS

2007/0069636 A1   3/2007   Choulis et al.
2008/0124570 A1   5/2008   Kondo et al.
(Continued)

FOREIGN PATENT DOCUMENTS

JP    2005-285749    10/2005
JP    2006-190759    7/2006
(Continued)

OTHER PUBLICATIONS

International Search Report, dated Feb. 16, 2016 from the Japan Patent Office (JPO), in corresponding International Application No. PCT/JP2015/005748.
(Continued)

*Primary Examiner* — Vu A Nguyen
(74) *Attorney, Agent, or Firm* — Greenblum & Bernstein, P.L.C.

(57) ABSTRACT

An organic electroluminescent (EL) element includes: a first electrode; an interlayer formed above the first electrode; an organic light-emitting layer formed using the interlayer as a foundation; and a second electrode formed above the organic light-emitting layer. The organic light-emitting layer
(Continued)

contains at least a host material and a dopant material. The interlayer is formed using a material which has an energy gap larger than an energy gap of the dopant material and a highest occupied molecular orbital (HOMO) level deeper than a HOMO level of the dopant material.

14 Claims, 5 Drawing Sheets

(51) Int. Cl.
  *C09K 11/06* (2006.01)
  *H05B 33/14* (2006.01)
  *G09F 9/30* (2006.01)
(52) U.S. Cl.
  CPC ........ *H01L 51/0004* (2013.01); *H01L 51/006* (2013.01); *H01L 51/0039* (2013.01); *H01L 51/0043* (2013.01); *H01L 51/0059* (2013.01); *H05B 33/14* (2013.01); *H05B 33/145* (2013.01); *H01L 51/0052* (2013.01); *H01L 51/5012* (2013.01); *H01L 51/5056* (2013.01); *H01L 51/5088* (2013.01); *H01L 2251/552* (2013.01)

(56) References Cited

U.S. PATENT DOCUMENTS

2012/0286653 A1* 11/2012 Abe .................... H01L 51/0043
  313/504
2013/0082251 A1 4/2013 Park et al.

FOREIGN PATENT DOCUMENTS

| JP | 2010-189454 | 9/2010 |
|---|---|---|
| JP | 2013-531658 A | 8/2013 |
| JP | 2014-187130 | 10/2014 |
| WO | 2005/052027 | 6/2005 |
| WO | 2011/071169 | 6/2011 |

OTHER PUBLICATIONS

Japan Office Action, dated Feb. 6, 2018, in the corresponding Japan Patent Application No. 2016-560061.
Decision of Refusal, dated Oct. 9, 2018, for the corresponding Japanese Patent Application No. 2016-560061.

* cited by examiner

FIG. 3

| Name of material | Arylamine | | | | Fluorene + arylamine | | | |
|---|---|---|---|---|---|---|---|---|
| | NPB | TPT1 | DNTPD | Poly-TPD | DMFL-NPB | NPAPF | NPBAPF | F8-TPA |
| Film forming method | Deposition | | | Coating | Deposition | | | Coating |
| Energy gap (eV) | 3.05 | 3.05 | 3.05 | 3.00 | 3.00 | 3.00 | 3.10 | 2.95 |
| HOMO level (eV) | 5.4 | 5.3 | 5.1 | 5.1 | 5.3 | 5.5 | 5.6 | 5.4 |

ORGANIC EL ELEMENT AND DISPLAY DEVICE

TECHNICAL FIELD

The present disclosure relates to an organic electroluminescent (EL) element and a display device having the same.

BACKGROUND ART

The organic EL element is expected to be applied to various light-emitting devices such as displays and lights. Examples include an organic EL display device (organic EL display panel) in which organic EL elements are used as pixels.

An organic EL element is configured to include a substrate, an anode, an organic light-emitting layer, and a cathode. In addition, in the organic EL element, charge function layers such as a charge injection layer and a charge transport layer are formed between the organic light-emitting layer and either the anode or the cathode as necessary.

As such an organic EL element, there is a deposition-type organic EL element in which an organic light-emitting layer is formed by depositing a low-molecular organic light-emitting material. The deposition-type organic EL element exhibits extremely high element performances. A deposition method has, however, a problem of being costly because layer formation is performed under high vacuum due to a low use efficiency of a material.

On the other hand, there is a coating-type organic EL element in which an organic light-emitting layer is formed by coating (printing) a high-polymer organic light-emitting material. A coating method has an advantage of achieving a low cost because it is possible to form the organic light-emitting layer under atmosphere by applying a required amount of ink in which an organic light-emitting material is dissolved. For example, PTL 1 discloses a coating-type organic EL element. In addition, in PTL 1, a foundation layer is provided with a crosslinking function so as not to be dissolved when a light-emitting layer is formed by coating (hereinafter, the foundation layer of the light-emitting layer having the crosslinking function is referred to as an interlayer). However, even when such an interlayer is used, there remains a problem that the element performances of a high-polymer organic light-emitting material are not sufficient compared to those of a low-molecular organic light-emitting material.

In view of this, there have been approaches for forming a low-molecular organic light-emitting material using a coating method (for example, PTL 2).

CITATION LIST

Patent Literature

[PTL 1] PCT International Publication No. 2005/052027
[PTL 2] Japanese Unexamined Patent Application Publication No. 2006-190759

SUMMARY OF INVENTION

Technical Problem

However, when a coating-type organic EL element is fabricated to have an interlayer formed using, as an organic light-emitting material, a low-molecular organic light-emitting material instead of a high-polymer organic light-emitting material, there is a problem that the element performances are lower than those of a deposition-type organic light-emitting material. In particular, when a blue organic light-emitting material is used as an organic light-emitting material in the coating-type organic EL element, the light-emitting efficiency of the coating-type organic EL element is extremely low. In addition, when the blue organic light-emitting material is used as the organic light-emitting material in the coating-type organic EL element, the life of the coating-type organic EL element is extremely short.

The present disclosure was made to solve the above problems, and has an object to provide an organic EL element which provides high element performances although the organic EL element is a coating-type organic EL element in which an organic light-emitting layer is formed using a low-molecular organic light-emitting material, and also provide a display device.

Solution to Problem

In order to achieve the above object, a first organic electroluminescent (EL) element according to an aspect includes a first electrode, an interlayer formed above the first electrode, an organic light-emitting layer formed using the interlayer as a foundation, and a second electrode formed above the organic light-emitting layer. The organic light-emitting layer contains at least a host material and a dopant material. The interlayer is formed using a material which has an energy gap larger than an energy gap of the dopant material and a highest occupied molecular orbital (HOMO) level deeper than a HOMO level of the dopant material.

In order to achieve the above object, a second organic EL element according to an aspect includes a first electrode, an interlayer formed above the first electrode, an organic light-emitting layer formed using the interlayer as a foundation, and a second electrode formed above the organic light-emitting layer. The organic light-emitting layer contains at least a host material and a dopant material. A material of the interlayer is a material which contains at least one of a crosslinking group and an insolubilizing group, and has a structural unit which includes arylamine but does not include fluorine. The structural unit is represented by any one of Chemical formulas 1, 2, and 3.

[Chemical formula 1]
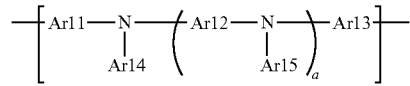

[Chemical formula 2]
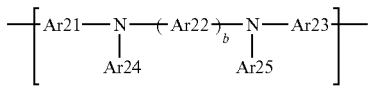

[Chemical formula 3]
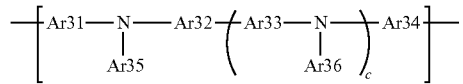

In Chemical formula 1, Ar11 to Ar15 each independently represent a same or different substituted or unsubstituted aromatic group, and a represents an integer ranging from 0 to 3.

In Chemical formula 2, Ar21 to Ar25 each independently represent a same or different substituted or unsubstituted aromatic group, and b represents an integer ranging from 0 to 3.

In Chemical formula 3, Ar31 to Ar36 each independently represent a same or different substituted or unsubstituted aromatic group, and c represents an integer ranging from 0 to 3.

In addition, the aromatic groups each independently represented by Ar11 to Ar15, Ar21 to Ar25, or Ar31 to Ar36 may include a condensed polycycle aromatic structure or a heterocyclic structure.

Advantageous Effects of Invention

Even in the case of a coating-type organic EL element having an organic light-emitting layer formed using a low-molecular organic light-emitting material, it is possible to implement an organic EL element which provides high element performances.

BRIEF DESCRIPTION OF DRAWINGS

FIG. 3 is a diagram indicating energy gaps, highest occupied molecular orbital levels, and film forming methods of respective materials used in the experiments.

DESCRIPTION OF EMBODIMENT

Figure 1:
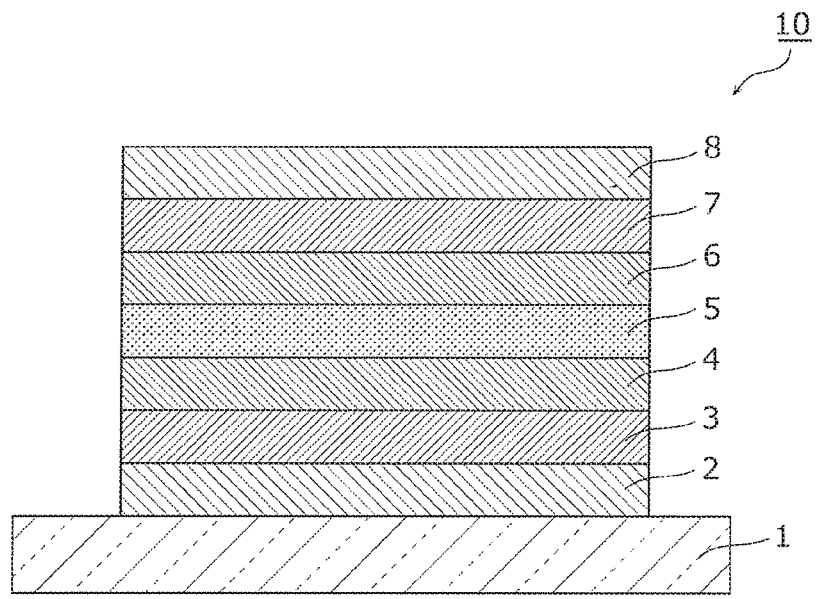
FIG. 1 is a cross-sectional view of an organic EL element according to an embodiment.

Hereinafter, an embodiment according to the present disclosure is described with reference to the drawings. The exemplary embodiment described below shows a preferred example of the present disclosure. Accordingly, the numerical values, shapes, materials, constituent elements, the arrangement and connection of the constituent elements shown in the following exemplary embodiment are mere examples, and therefore do not limit the scope of the present disclosure. Therefore, among the constituent elements in the following exemplary embodiment, constituent elements not recited in any one of the independent claims that define the most generic concept of the present disclosure are described as arbitrary constituent elements.

It is to be noted that each of the drawings is a schematic diagram, and thus is not always illustrated precisely. In addition, substantially the same elements are assigned with the same reference numerals in the drawings, and overlapping descriptions thereof are omitted or simplified.

Embodiment

Configuration of Organic EL Element

First, an organic EL element 10 according to an embodiment is described with reference to FIG. 1. FIG. 1 is a cross-sectional view of the organic EL element according to the embodiment.

As illustrated in FIG. 1, the organic EL element 10 has a laminated configuration in which the following are stacked in the listed order: a substrate 1; a first electrode 2; a hole injection layer 3; an interlayer 4; an organic light-emitting layer 5; an electron transport layer 6; an electron injection layer 7; and a second electrode 8.

The organic EL element 10 according to this embodiment is a coating-type organic EL element in which at least the organic light-emitting layer 5 is formed using a coating method. As an example, in the organic EL element 10, the first electrode 2 is formed using a sputtering method, the hole injection layer 3, the interlayer 4, and the organic light-emitting layer 5 are formed using a coating method (printing method), and the electron transport layer 6, the electron injection layer 7, and the second electrode 8 are formed using a deposition method.

The substrate 1 is an optically transmissive substrate having a light transmittance such as a translucent substrate, and is for example a glass substrate made of a glass material. It is to be noted that the substrate 1 is not limited to the glass substrate, and may be an optically transmissive resin substrate made of an optically transmissive resin material that is for example a poly-carbonate resin or an acrylic resin, or a thin-film transistor (TFT) substrate which is a backplane of the organic EL display device.

The first electrode 2 is a lower electrode, and is formed on the substrate 1. The first electrode 2 is a translucent electrode having a light transmittance, and is formed to include a translucent conductive film of a translucent conductive material that is, for example, an indium tin oxide (ITO), an indium zinc oxide (IZO), or the like, The first electrode 2 in this embodiment is a translucent electrode including an ITO film. In addition, in this embodiment, the first electrode 2 is an anode. It is to be noted that the first electrode 2 is not limited to the translucent electrode, and may be, for example, a reflecting electrode having a reflectivity that is for example aluminium (Al), silver (Ag), an alloy including aluminium or silver, or the like, or may be laminated layers of a reflecting electrode and a translucent electrode.

The hole injection layer 3 is formed on the first electrode 2. The hole injection layer 3 intervenes between the first electrode 2 and the organic light-emitting layer 5, and has a function for injecting holes into the organic light-emitting layer 5.

As a material for the hole injection layer 3, for example, a polythiophene derivative, a polyaniline derivative, a polypyrrole derivative, or the like is used. More specifically, a mixture of polythiophene and polystyrene sulfonic acid (PEDOT:PSS) is used. In addition, a metal oxide may be used for the hole injection layer 3. More specifically, an oxide that is tungsten (W), molybdenum (Mo), silver (Ag), chromium (Cr), vanadium (V), nickel (Ni), iridium (Ir), or the like is used. In this embodiment, the hole injection layer 3 is PEDOT: PSS.

The interlayer 4 is formed above the first electrode 2. In this embodiment, the interlayer 4 is formed on the hole injection layer 3. The interlayer 4 is a foundation layer of the organic light-emitting layer 5, and has a crosslinking function. The crosslinking function is a function by which crosslinking groups or insolubilizing groups are chemically changed by heat, irradiation of energy rays such as ultraviolet rays, or a combination of these, to be insoluble in an organic solvent or water. By forming the interlayer 4 having the crosslinking function, it is possible to prevent the interlayer 4 from dissolving when the organic light-emitting layer 5 is formed using the coating method.

In addition, the interlayer 4 intervenes between the hole injection layer 3 and the organic light-emitting layer 5, and has a function for transporting charge (holes in this embodiment) injected from the hole injection layer 3 to the organic light-emitting layer 5.

In this embodiment, the interlayer 4 is configured with a material having a crosslinking function. In addition, the interlayer 4 is configured with a material having an energy gap (Eg) larger than that of the dopant material of the organic light-emitting layer 5. In this embodiment, the interlayer 4 is configured with a material having Eg larger than that of a host material of the organic light-emitting layer 5. For example, the energy gap of the material of the interlayer 4 is 2.95 eV or more, and preferably 3.10 eV or more. It is to be noted that Eg is an energy difference between a HOMO level and a lowest unoccupied molecular orbital (LUMO) level.

As examples of methods for measuring a HOMO level, here are listed photoemission spectroscopy in air, an electrochemical method (cyclic voltammetry), photoemission spectroscopy (PES), etc. On the other hand, as examples of methods for measuring a LUMO level, here are listed inverse photoemission spectroscopy (IPES), a method for calculating the LUMO level from a HOMO level and an energy gap calculated from an absorption edge using an optical absorption spectroscopy, etc. Alternatively, a method for calculating a HOMO level and a LUMO level by performing calculation using a molecular orbital method may be used.

In addition, the interlayer 4 is configured with a material having a deeper HOMO level than that of the dopant material of the organic light-emitting layer 5. in other words, the interlayer 4 is configured with a material having a larger energy level (HOMO level) than the HOMO level of the dopant material of the organic light-emitting layer 5. In this embodiment, the HOMO level of the material in the interlayer 4 is approximately equal to the HOMO level of the host material of the organic light-emitting layer 5.

As a material for the interlayer 4, for example, a material having a structural unit represented by any one of the following Chemical formulas 1 to 3 can be used. For example, the material of the interlayer 4 is a material which contains at least one of a crosslinking group and an insolubilizing group, and has a structural unit which includes arylamine but does not include fluorene. The structural unit is represented by any one of the following Chemical formulas 1 to 3 below.

[Chemical formula 1]

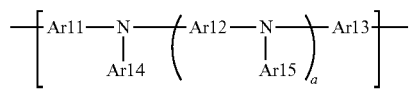

[Chemical formula 2]

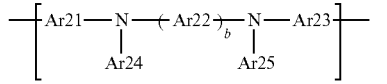

[Chemical formula 3]

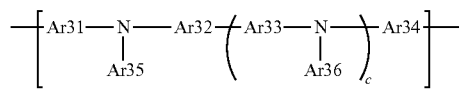

In Chemical formula 1, Ar11 to Ar15 each independently represent a same or different substituted or unsubstituted aromatic group, and a represents an integer ranging from 0 to 3.

In Chemical formula 2, Ar21 to Ar25 each independently represent a same or different substituted or unsubstituted aromatic group, and b represents an integer ranging from 0 to 3.

In Chemical formula 3, Ar31 to Ar36 each independently represent a same or different substituted or unsubstituted aromatic group, and c represents an integer ranging from 0 to 3.

In addition, the aromatic groups each independently represented by Ar11 to Ar15, Ar21 to Ar25, or Ar31 to Ar36 may include a condensed polycycle aromatic structure or a heterocyclic structure.

In addition, it is preferable that the interlayer 4 include a charge blocking function for reducing passing through of charge (in this embodiment, electrons) from the organic light-emitting layer 5 to the first electrode 2, a function for reducing extinction of light in an excitation state of the organic light-emitting layer 5, and/or the like.

The organic light-emitting layer 5 is formed on the interlayer 4. More specifically, the organic light-emitting layer 5 is formed using the interlayer 4 as the foundation in a coating process (according to a coating method). A low-molecular material is used as a material for the organic light-emitting layer 5. As an example, the organic light-emitting layer 5 is a blue light-emitting layer configured with a blue low-molecular organic light-emitting material. Here, low-molecular materials are referred to as chemical compounds having a molecular weight of 5000 or less.

In addition, the organic light-emitting layer 5 is a layer which emits light by means of holes injected from the anode (the first electrode 2 in this embodiment) and electrons injected from the cathode (the second electrode 8 in this embodiment) being re-coupled to form excitons inside the organic light-emitting layer 5.

The organic light-emitting layer 5 may be configured only with a dopant material, but it is preferable that the organic light-emitting layer 5 include a host material and a dopant material. A host material mainly provides a function for transporting charge of electrons or holes, and a dopant material provides a light emission function.

Host materials are not limited to one kind, and may be two or more kinds. The amount of dopant material is appropriate in a range from 0.01 weight percent to 30 weight percent, but is preferably be in a range from 0.01 weight percent to 10 weight percent. It is to be noted that, when two or more kinds of host materials are included, the host material of the organic light-emitting layer 5 is referred to as the host material having the smallest energy gap.

Examples of host materials for the organic light-emitting layer include amine compounds, condensed polycycle aromatic compounds, and heterocyclic compounds.

Examples of amine compounds for use include monoamine derivatives, dinoamine derivatives, triamine derivatives, and tetraamine derivatives.

Examples of condensed polycycle aromatic compounds include anthracene derivatives, naphthalene derivatives, naphthacene derivatives, phenanthrene derivatives, chrysene derivatives, fluoranthene derivatives, triphenylene derivatives, pentacene derivatives, and perylene derivatives.

Examples of heterocyclic compounds include carbazole derivatives, furan derivatives, pyridine derivatives, pyrimidine derivatives, triazine derivatives, imidazole derivatives, pyrazole derivatives, triazole derivatives, oxazole derivatives, oxadiazole derivatives, pyrrole derivatives, indole derivatives, azaindole derivatives, azacarbazoles, pyrazoline derivatives, pyrazolone derivatives, and phthalocyanine derivatives.

In addition, examples of dopant materials of the organic light-emitting layer 5 include pyrene derivatives, fluoranthene derivatives, aryl acetylene derivatives, fluorene derivatives, perylene derivatives; oxadiazole derivatives, anthracene derivatives, and chrysene derivatives. In addition, a metal complex may be used as a dopant material of the organic light-emitting layer 5. Examples of metal complexes include metal complexes having metal atoms of, for example, iridium (Ir), platinum (Pt), osmium (Os), gold (Au), rhenium (Re), ruthenium (Ru), or the like and ligands thereof.

The electron transport layer 6 is formed on the organic light-emitting layer 5. The electron transport layer 6 intervenes between the organic light-emitting layer 5 and the second electrode 8, and has a function for transporting electrons injected from the second electrode 8 to the organic light-emitting layer 5. In addition, it is preferable that the electron transport layer 6 include a charge blocking function for reducing passing through of charge (in this embodiment, holes) from the organic light-emitting layer 5 to the second electrode 8, a function for reducing extinction of light in an excitation state of the organic light-emitting layer 5, and/or another function.

As a material for the electron transport layer 6, for example, an aromatic group heterocyclic compound having at least one hetero atom in a molecular is used. Examples of aromatic group heterocyclic compounds include compounds having, in a skelton, a pyridine ring, a pyrimidine ring, a triazine ring, a benzimidazole ring, a phenanthroline ring, a quinazoline ring, or the like.

The electron injection layer 7 is formed on the electron transport layer 6. The electron injection layer 7 intervenes between the electron transport layer 6 and the second electrode 8, and has a function for injecting electrons to the organic light-emitting layer 5.

As a material for the electron injection layer 7, for example, a metal, a metal fluoride, or a metal oxide is used. Examples of metals, metal fluorides, and metal oxides include metals such as lithium (Li), sodium (Na), magnesium (Mg), aluminum (Al), kalium (K), cesium (Cs), barium (Ba), strontium (Sr), fluorides thereof, and oxides thereof. In addition, as a material for the electron injection layer 7, a metal complex may be used. Examples of metal complexes include, for example, 8-quinolinolato sodium, 8-quinolinolato lithium, lithium 2-(2-pyridyl) phenolate, and lithium 2-(2',2''-bipyridine-6'-yl) phenolate.

The second electrode 8 is formed on the electron transport layer 6. The second electrode 8 according to the embodiment is a reflecting electrode having a reflectivity, and is a metal electrode formed using a metal material having a reflectivity. In addition, in this embodiment, the second electrode 8 is a cathode.

As a material for the second electrode 8, for example, aluminum (Al), magnesium (Mg), silver (Ag), an alloy of aluminum and lithium, an alloy of magnesium and silver, or the like is used. It is to be noted that the second electrode 8 is not limited to the reflecting electrode, and may be a translucent electrode such as an ITO film similarly to the first electrode 2, or the like.

In the organic EL element 10 configured like this, when a predetermined voltage is applied between the first electrode 2 and the second electrode 8 via a power source line (not illustrated) or the like, holes and electrons are injected respectively from the first electrode 2 and the second electrode 8 to the organic light-emitting layer 5. The holes and the electrons are coupled in the organic light-emitting layer 5, producing light.

In this embodiment, the substrate 1 and the first electrode 2 have a transmittance, and the second electrode 8 has a reflectivity, and thus the organic EL element 10 has a bottom emission structure in which light is irradiated from a substrate 1 side. It is to be noted that the structure of the organic EL element 10 is not limited to the bottom emission structure, and the organic EL element 10 may have a top emission structure.

Features of Organic EL Element

Next, descriptions are given of features of the organic EL element 10 according to this embodiment, and how things led up to the technique according to the present disclosure.

In general, an organic EL element has a structure in which an anode, an organic light-emitting layer, and a cathode are laminated on or above a substrate, and charge function layers such as a charge injection layer and a charge transport layer are formed between the organic light-emitting layer, the anode, and the cathode.

Figure 2:
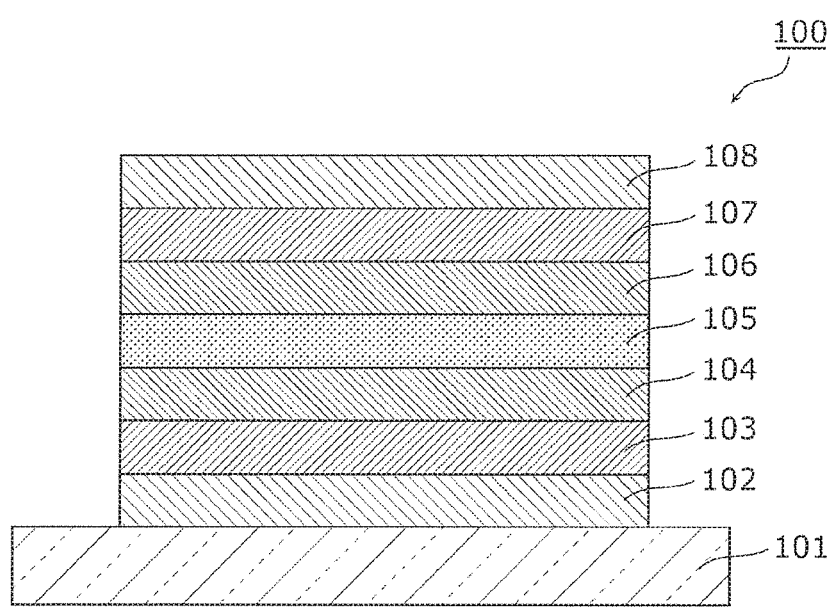
FIG. 2 is a cross-sectional view of an organic EL element used in one of experiments.

As illustrated in FIG. 2, for example, the organic EL element 100 has a structure in which the following elements are laminated in the listed order: a substrate 101; a first electrode (anode) 102; a hole injection layer 103; a hole transport layer 104; an organic light-emitting layer 105; an electron transport layer 106; an electron injection layer 107; and a second electrode (cathode) 108.

In the case of a deposition-type organic EL element in which an organic light-emitting layer 105 is formed by depositing an organic light-emitting material, for example, a hole injection layer 103, a hole transport layer 104, an organic light-emitting layer 105, an electron transport layer 106, an electron injection layer 107, and a second electrode 108 are respectively formed in this order using a deposition method.

On the other hand, in the case of a coating-type organic EL element in which an organic light-emitting layer 105 is formed by applying (printing) an organic light-emitting material, a hole injection layer 103 is formed using a coating method (a printing method) or a sputtering method, and a hole transport layer 104 and an organic light-emitting layer 105 are formed on the hole injection layer 103 using a coating method (a printing method), and an electron transport layer 106, an electron injection layer 107, and the second electrode (cathode) 108 are formed on the organic light-emitting layer 105 using a deposition method.

When an organic light-emitting layer 105 is formed using a coating method, a hole transport layer 104 needs to have an interlayer having a crosslinking function as a foundation layer of the organic light-emitting layer 105. By doing so, it is possible to prevent the hole transport layer 104 from dissolving when the organic light-emitting layer 105 is formed.

In order to control a hole transporting property and solubility, a material used for the interlayer is, for example, a material which has a structural unit having a molecular structure which includes fluorene and arylamine, or a derivative thereof. The structural unit is represented by the following Chemical formula 4. Furthermore, the material used for the interlayer has a crosslinking function. Such a material has features of having a narrow energy gap and a shallow HOMO level.

[Chemical formula 4]

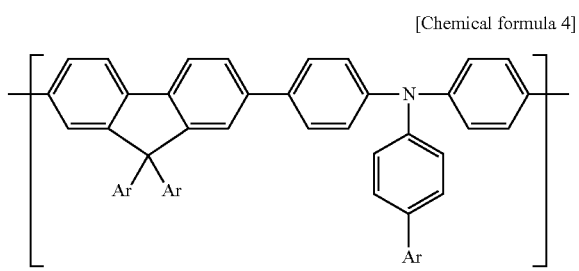

The Inventors keenly studied materials for interlayers in organic EL elements which can provide excellent element performances even in the case where the organic EL elements are coating-type organic EL elements in each of which a low-molecular organic light-emitting material is used as a material for an organic light-emitting layer.

First, the Inventors evaluated the light-emission efficiencies of organic EL elements 100 focusing on physical properties of materials in the interlayers thereof.

More specifically, organic EL elements 100 were fabricated using materials shown in FIG. 3 as materials for hole transport layers 104 in FIG. 2, and the light-emitting efficiencies of the respective organic EL elements 100 were evaluated. Hereinafter, the experiments and the evaluation results are described.

First, specific materials used in the experiments are described with reference to FIG. 3. FIG. 3 illustrates the materials used in the experiments, the energy gap and the HOMO level of each of the materials, and the film forming method of each material. It is to be noted that, in each experiment, the HOMO level is measured using a photoemission spectroscopy in air, and the energy gap is calculated from an absorption edge wavelength using an optical absorption spectroscopy.

"NPB" is a low-molecular material represented by Chemical formula 5 below, and has a structure in which fluorene is not included and arylamine is included. In addition, "NPB" has an energy gap of 3.05 (eV), and a HOMO level of 5.4 (eV). In the experiment, "NPB" was formed using a deposition method.

[Chemical formula 5]

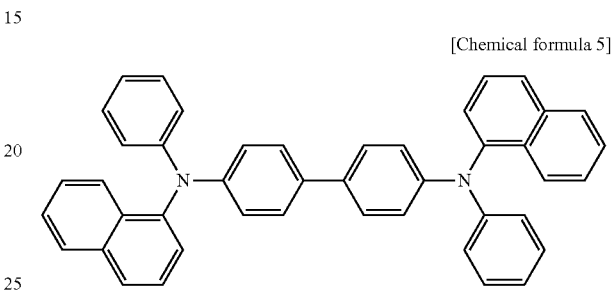

"TPT1" is a low-molecular material represented by Chemical formula 6 below, and has a structure in which fluorene is not included and arylamine is included. In addition, "TPT1" has an energy gap of 3.05 (eV), and a HOMO level of 5.3 (eV). In the experiment, "TPT1" was formed using a deposition method.

[Chemical formula 6]

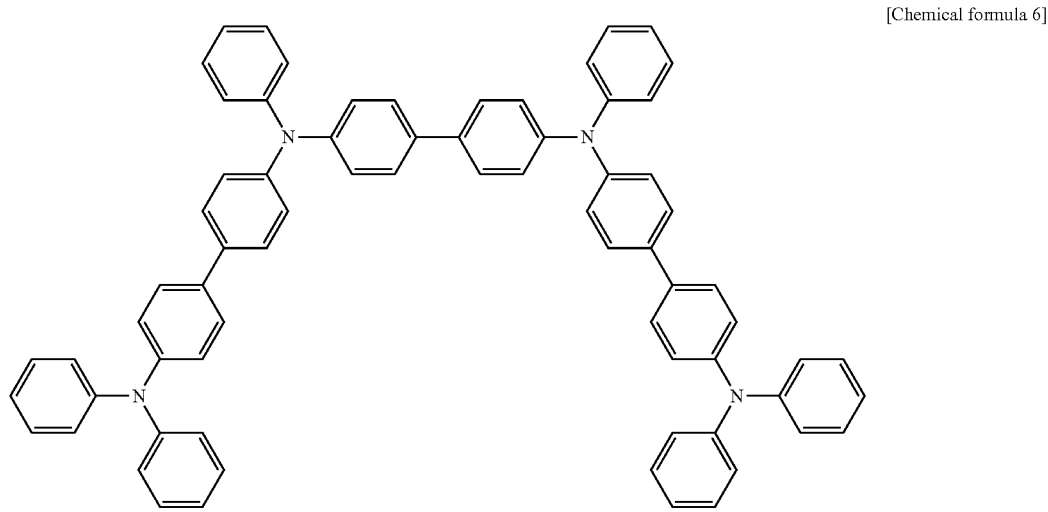 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]

"DNTPD" is a low-molecular material which has a structure in which fluorene is not included and arylamine is included, as represented by Chemical formula 7 below. In addition, "DNTPD" has an energy gap of 3.05 (eV), and a HOMO level of 5.1 (eV). In the experiment, "DNTPD" was formed using a deposition method.

[Chemical formula 7]

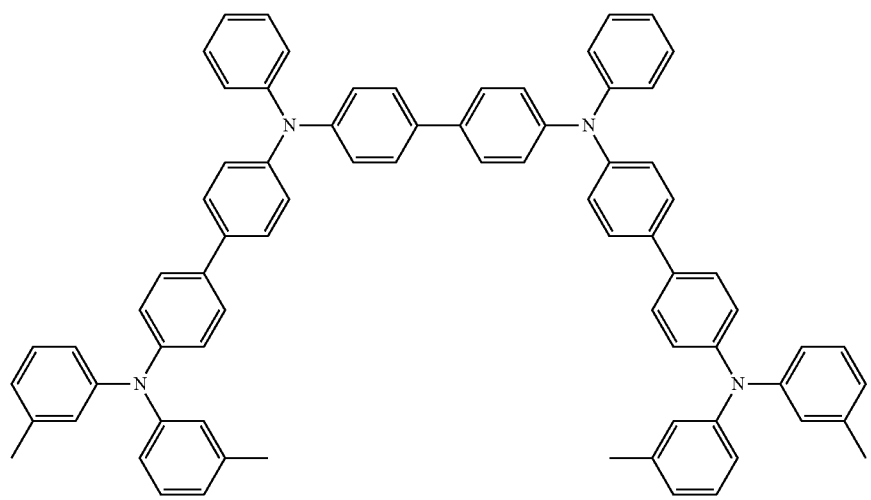

"Poly-TPD" is a high-polymer material which has a structural unit which does not include fluorene but includes arylamine, as represented by Chemical formula 8 below. In addition, "Poly-TPD" has an energy gap of 3.00 (eV), and a HOMO level of 5.1 (eV). In the experiment, "Poly-TPD" was formed using a coating method.

[Chemical formula 8]

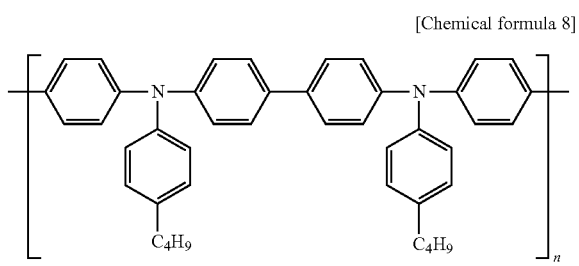

"DMFL-NPB" is a low-molecular material which has a structure in which fluorene and arylamine are included, as represented by Chemical formula 9 below. In addition, "DMFL-NPB" has an energy gap of 3.00 (eV), and a HOMO level of 5.3 (eV). In the experiment, "DMFL-NPB" was formed using a deposition method.

[Chemical formula 9]

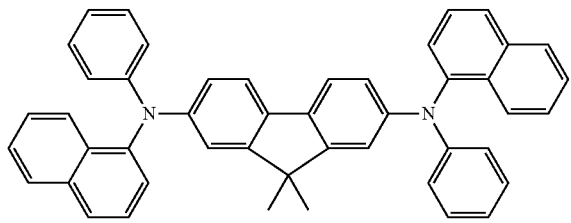

"NPAPF" is a low-molecular material which has a structure in which fluorene and arylamine are included, as represented by Chemical formula 10 below. In addition, "NPAPF" has an energy gap of 3.00 (eV), and a HOMO level of 5.3 (eV). In the experiment, "NPAPF" was formed using a deposition method.

[Chemical formula 10]

"NPBAPF" is a low-molecular material which has a structure in which fluorene and arylamine are included, as represented by Chemical formula 11 below. In addition, "NPBAPF" has an energy gap of 3.10 (eV), and a HOMO level of 5.6 (eV). In the experiment, "NPBAPF" was formed using a deposition method.

[Chemical formula 11]

"F8-TPA" is a high-polymer material which has a structural unit which includes fluorene and arylamine, as represented by Chemical formula 12 below. In addition, "F8-TPA" has an energy gap of 2.95 (eV), and a HOMO level of 5.4 (eV). In the experiment, "F8-TPA" was formed using a coating method.

[Chemical formula 12]

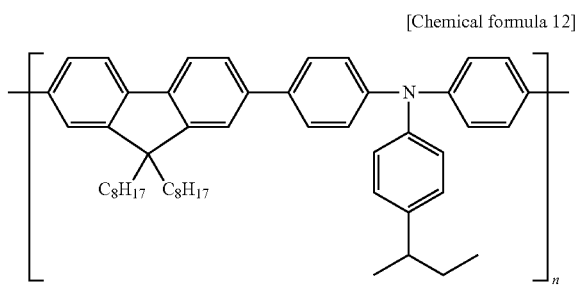

It is to be noted that the following materials are used for organic light-emitting layers: a host material having an energy gap of 2.95 (eV) and a HOMO level of 5.8 (eV), and a dopant material having an energy gap of 2.80 (eV) and a HOMO level of 5.3 (eV).

Figure 4:
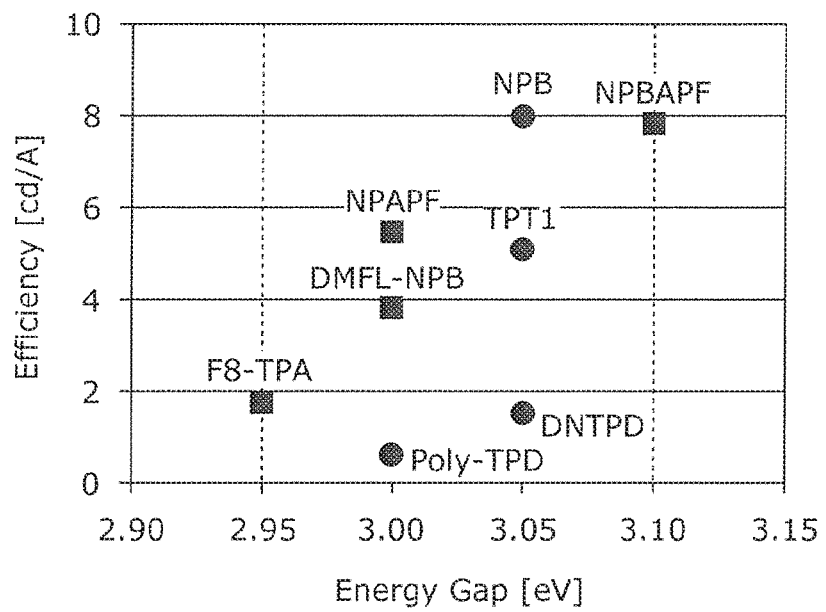
FIG. 4 is a diagram illustrating relationships between the energy gaps of the respective materials and light-emitting efficiencies of organic EL elements when the organic EL elements were fabricated using the respective materials in FIG. 3.

FIG. 4 illustrates relationships between the energy gaps of the respective materials and light-emitting efficiencies of organic EL elements each fabricated using a corresponding one of the materials in FIG. 3. It is known that the light-emitting efficiencies of the organic EL elements each of which has a hole transport layer formed using a corresponding one of "F8-TPA", "DMFL-NPB", "NPAPF", "TPT1", "NPB", and "NPBAPF" vary in accordance with the magnitudes of the energy gaps of the materials, and that a higher light-emitting efficiency is obtainable with increase in energy gap.

Figure 5:
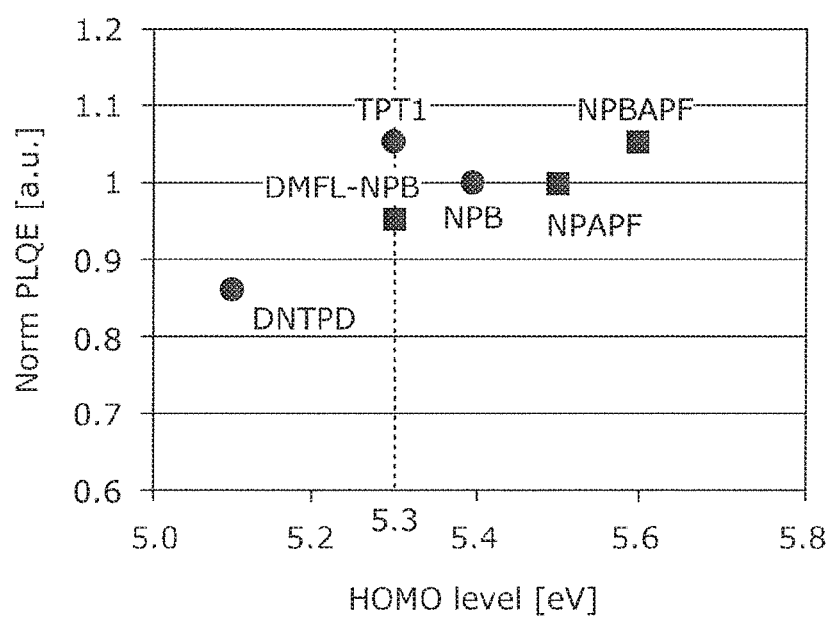
FIG. 5 is a diagram illustrating relationships between HOMO levels and photo luminecense quantum efficiencies (PLQE) of the respective materials when mixture films of the respective materials in FIG. 3 and dopants of the organic light-emitting layers were fabricated.

On the other hand, the light-emitting efficiencies of the organic EL elements each of which has a hole transport layer formed using a corresponding one of "Poly-TPD" and "DNTPD" is low irrespective of the energy gap of each material. In view of this, PLQE of a monolayer film formed by depositing both of each material in FIG. 3 other than "F8-TPA" and "Poly-TPD" which are high-polymer materials, and a dopant material of a corresponding one of the organic light-emitting layers at a film forming ratio of 1: 1. The PLQE is a ratio of the number of photons absorbed in a material and the number of photons emitted from the material when the monolayer film which has been set inside an integrating sphere is irradiated with excitation light. FIG. 5 illustrates the relationships between the HOMO levels and the PLQE values of the respective materials, and illustrates that only the PLQE value of a co-deposition film of "DNTPD" decreased, "DNTPD" has a shallower HOMO level than the HOMO level of the dopant material in the organic light-emitting layer. In the PLQE evaluation performed at that time, excitation light having a wavelength of 420 nm was used to selectively excite the dopant.

Figure 6:
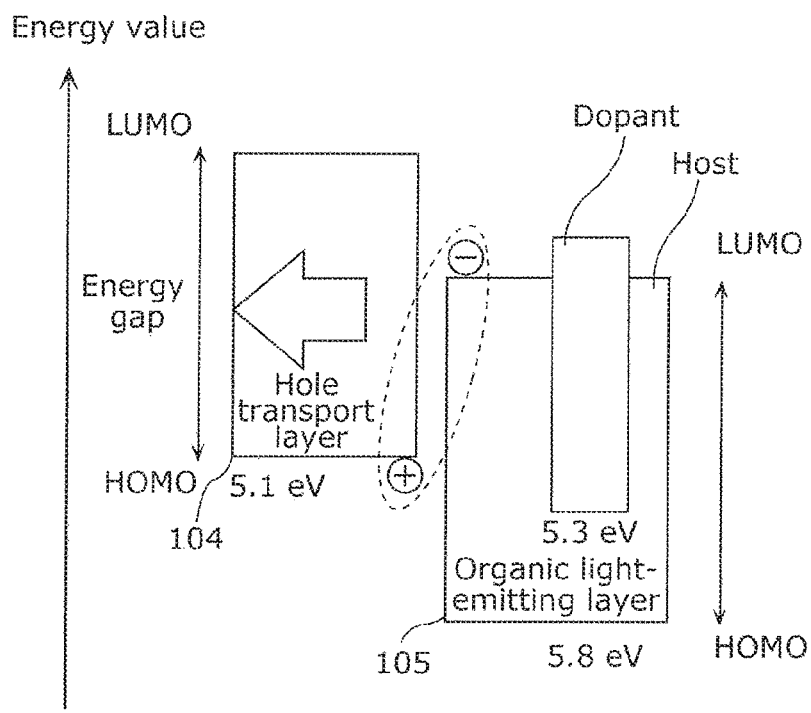
FIG. 6 is a diagram illustrating energy between an organic light-emitting layer and a hole injection layer in an organic EL element fabricated using either "DNTPD" or "Poly-TPD".

The phenomenon occurred at that time is described with reference to FIG. 6. FIG. 6 is a diagram illustrating energy between an organic light-emitting layer and a hole injection layer in an organic EL element when "DNTPD" or "Poly-TPD" is used for the hole injection layer.

As illustrated in FIG. 6, in the organic EL element, when the HOMO level of the hole transport layer was shallower than the HOMO level of the dopant material in the organic light-emitting layer, two kinds of molecules which are molecules of the host material in the organic light-emitting layer and the molecules of the material in the hole transport layer were coupled to form exciplexes at the interface between the hole transport layer and the organic light-emitting layer, which caused emission or extinction of light.

It is considered that each of the materials ("DNTPD" and "Poly-TPD") having a low light-emission efficiency in FIG. 5 and the organic light-emitting layer 105 formed the exciplexes because of its shallow HOMO level. It is considered that this results in the low light-emission efficiency.

As a result of keen study based on the above experiment results and evaluation, the Inventors obtained knowledge that using a material having a desired energy gap and a desired HOMO level to form an interlayer which becomes a foundation of an organic light-emitting layer makes it is possible to prevent movement of energy from the organic light-emitting layer to the interlayer to prevent light extinction between the organic light-emitting layer and the interlayer, and to thereby increase the light emission efficiency.

In addition, the Inventors found that, even in the case of a coating-type organic EL element, such as the organic EL element 10 illustrated in FIG. 1, which has an organic light-emitting layer 5 made of a low-molecular organic light-emitting material using a coating method, it is possible to implement an organic EL element which provides a high light emission efficiency by providing it with an interlayer 4 which has an energy gap larger than the energy gap of the dopant material in the organic light-emitting layer 5 and a HOMO level deeper than the HOMO level of the dopant material in the organic light-emitting layer 5.

Conventionally, in particular, it has been difficult to increase the light emission efficiency of a coating-type organic EL element having an organic light-emitting layer formed using a blue low-molecule organic light-emitting material as a material for the organic light-emitting layer 5. The Inventors, as described above however, found that it is possible to achieve an organic EL element having an excellent light emission efficiency by providing an interlayer 4 having an energy gap larger than the energy gap of the dopant material in the organic light-emitting layer 5 and a HOMO level deeper than the HOMO level of the dopant material in the organic light-emitting layer 5.

The Inventors further found that an organic EL element which provides a higher light emission efficiency can be achieved by increasing the energy gap of the material in the interlayer 4 to be larger than the energy gap of the host material in the organic light-emitting layer 5.

In this case, as illustrated in FIG. 4, in order to achieve a light emission efficiency at a certain level or above, it is only necessary that the material in the interlayer 4 have an energy gap of 2.95 eV or more.

In addition, as illustrated in FIG. 4, it is considered that light emission efficiency does not increase when an energy is 3.10 eV or more. Thus, it is further preferable that the material in the interlayer 4 has an energy gap of 3.10 eV or more.

The Inventors further found that, an organic EL element which provides a high light emission efficiency can be achieved reliably by making the HOMO level of the material in the interlayer 4 to be approximately equal to the HOMO level of the host material in the organic light-emitting layer 5.

In this way, even in the case of a coating-type organic EL element, such as the organic EL element 10 according to this embodiment, which has an organic light-emitting layer 5 made of a low-molecular organic light-emitting material, it is possible to implement an organic EL element which provides a high light emission efficiency by providing it with an interlayer 4 which has an energy gap larger than the energy gap of the dopant material in the organic light-emitting layer 5 and a HOMO level deeper than the HOMO level of the dopant material in the organic light-emitting layer 5.

Furthermore, the Inventors evaluated life characteristics of the organic EL elements 100 focusing on the materials in the interlayers.

Figure 7:
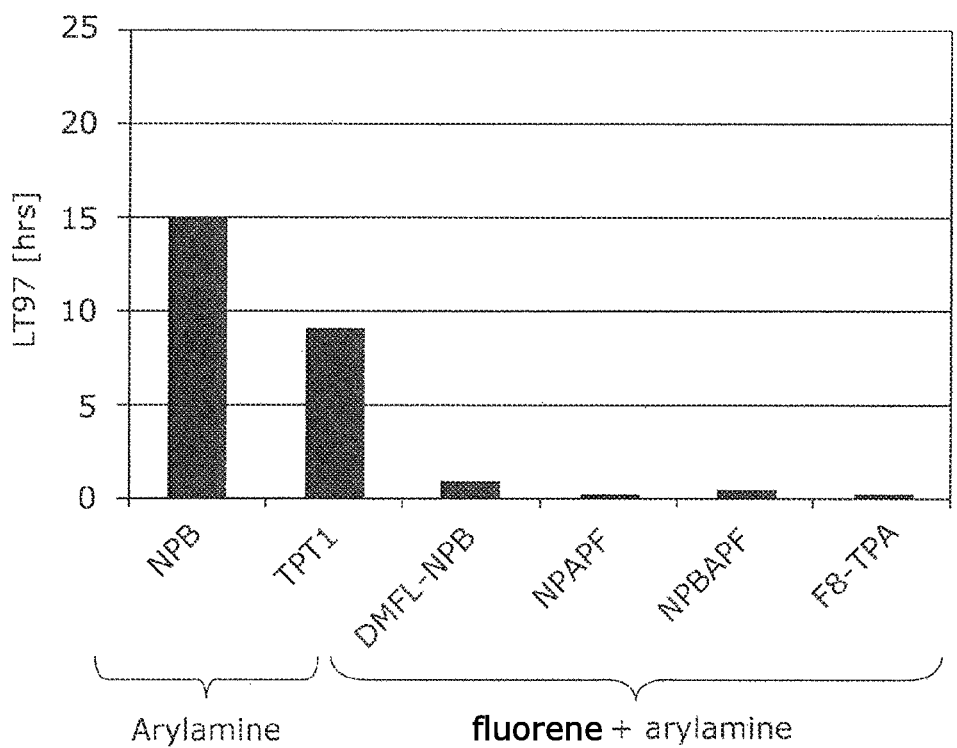
FIG. 7 is a diagram illustrating life characteristics of the organic EL elements each fabricated using a corresponding one of the materials in FIG. 3.

FIG. 7 is a diagram illustrating the life characteristics of the respective organic EL elements each fabricated using a corresponding one of the materials in FIG. 3. In FIG. 7, "LT97" represents life characteristics, and represents time that lasted until luminance decreased to 97% from an initial luminance of 100%.

As illustrated in FIG. 7, the organic EL elements each fabricated using a corresponding one of materials ("DMFL-NPB", "NPAPF", "NPBAPF", and "F8-TPA") which contain both of fluorene and arylamine have short lives. On the other hand, the organic EL elements each fabricated using a corresponding one of materials ("NPB" and "TPT1") which do not contain fluorene but contain arylamine have long lives.

More specifically, the lives of the organic EL elements each fabricated using a corresponding one of materials ("NPB" and "TPT1") which do not contain fluorene but contain arylamine are approximately 10 times longer than the lives of the organic EL elements each fabricated using a corresponding one of materials ("DMFL-NPB", "NPAPF", "NPBAPF", and "F8-TPA") which contain both of fluorene and arylamine.

The Inventors found that the organic EL elements each fabricated using the corresponding one of the materials which do not contain fluorene but contain arylamine have longer lives as described above.

Figure 8:
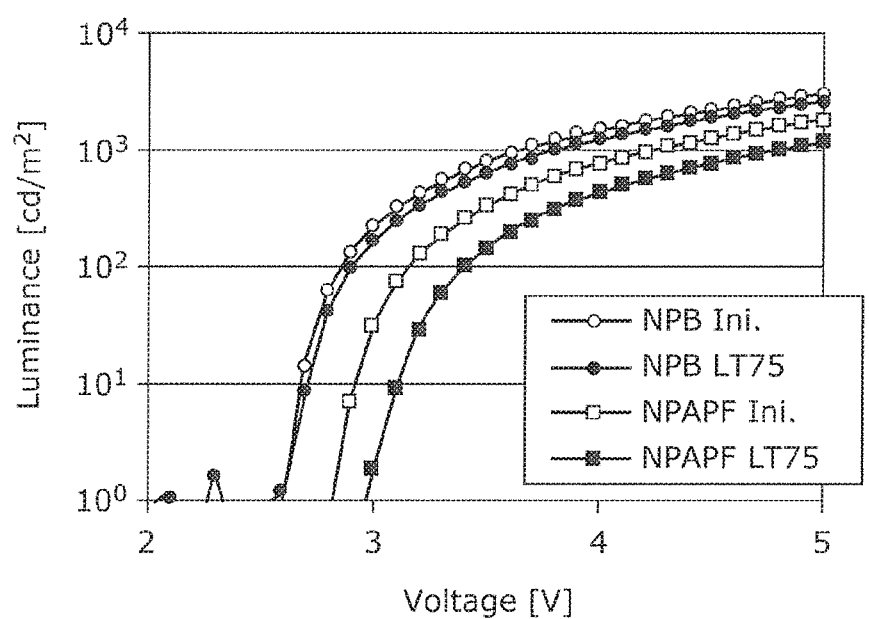
FIG. 8 is a diagram illustrating voltage—luminance characteristics before and after the evaluation of lives of the organic EL elements each fabricated using a corresponding one of "NPB" and "NPAPF".

In addition, the Inventors evaluated the voltage—luminance characteristics before and after the evaluation on the lives of the organic EL elements each fabricated using a corresponding one of
"NPB" and "NPAPF" among the materials shown in FIG. 3. FIG. 8 is a diagram illustrating voltage—luminance characteristics before and after the evaluation on the lives of the respective organic EL elements each fabricated using a corresponding one of "NPB" and "NPAPF".

It is to be noted that, in FIG. 8, each of "NPBIni." And "NPAPFIni." shows a voltage—luminance characteristic at an initial state, and each of "NPBLT75" and "NPAPFLT75" shows a voltage—luminance characteristic at the time when a luminance decreased to 75% from an initial luminance of 100%.

As illustrated in FIG. 8, the organic EL element fabricated using "NPB" that is a material which does not contain fluorene but contains arylamine requires a smaller voltage variation amount to obtain a same luminance than the voltage variation amount required in the case of the organic EL element fabricated using "NPAPF" that is a material which contains fluorene and arylamine.

More specifically, for example, before and after the evaluation on the lives, the voltage required to obtain a luminance of 1000 cd/m² increased by 0.2 V in the case of the organic EL element fabricated using "NPB" that is a material which does not contain fluorene but contains arylamine, while the voltage required to obtain the luminance of 1000 cd/m² increased by 0.6 V in the case of the organic EL element fabricated using "NPAPF" that is a material which contains fluorene and arylamine.

In other words, the organic EL element fabricated using "NPAPF" which contains fluorene and arylamine requires a larger voltage increase width to obtain the same luminance than the voltage increase width required in the case of the organic EL element fabricated using "NPB" which is a material which does not contain fluorene but contains arylamine.

It is considered that, when these organic EL elements are energized to evaluate on their lives, the organic EL element fabricated using "NPB" which is a material that does not contain fluorene but contains arylamine experienced decrease in the light emission performances of the light-emitting layer, and the organic EL element fabricated using "NPAPF" which is a material that contains fluorene and arylamine suffered from not only decrease in the light emission performances of the light-emitting layer but also deterioration of the "NPAPF" itself. More specifically, it is considered that the energization at the time of the evaluation on the lives also deteriorates the fluorene part of the "NPAPF".

As a result of keen study based on the above experiment results and evaluation, the Inventors obtained knowledge that it is possible to prevent decrease in the lives of the organic EL elements by avoid containing fluorene as a material in the interlayers which become foundations of the respective organic light-emitting layers.

In addition, the Inventors found that, even in the case of a coating-type organic EL element, such as the organic EL element 10 illustrated in FIG. 1, which has an organic light-emitting layer 5 made of a low-molecular organic light-emitting material using a coating method, it is possible to implement an organic EL element which has a long life by using, as a material for an interlayer 4, a material which includes at least one of a crosslinking group and an insolubilizing group, has the structural unit which includes arylamine but does not include fluorene, as represented by any one of the following Chemical formulas 1 to 3.

Conventionally, in particular, coating-type organic EL elements each having an organic light-emitting layer 5 made of a blue low-molecular organic light-emitting material only have short lives. The Inventors, however, found that it is possible to achieve an organic EL element having a long life by using the interlayer 4 as described above.

In this way, even in the case of a coating-type organic EL element, such as the organic EL element 10 according to this embodiment, which has an organic light-emitting layer 5 made of a low-molecular organic light-emitting material, it is possible to implement an organic EL element which has a long life by using, as a material for the interlayer 4, the material which includes at least one of a crosslinking group and an insolubilizing group, has the structural unit which includes arylamine but does not include fluorene, as represented by any one of the following Chemical formulas 1 to 3. In this case, it is possible to achieve the organic EL element which has a longer life because the material in the interlayer 4 has the crosslinking function by which it is possible to prevent the interlayer 4 from dissolving when the organic light-emitting layer 5 is formed using the coating method.

Furthermore, in the organic EL element 10 according to this embodiment, it is good to use, as a material for the interlayer 4, a material which: has an energy gap larger than the energy gap of the dopant material in the organic light-emitting layer 5 and a HOMO level deeper than the HOMO level of the dopant material in the organic light-emitting layer 5; includes at least one of a crosslinking group and an insolubilizing group; has a structural unit which includes arylamine but does not include fluorene, as represented by any one of Chemical formulas 1 to 3. In this way, it is possible to achieve the organic EL element which provides a high light-emitting efficiency and a long life.

As described above, even in the case of a coating-type organic EL element, such as the organic EL element 10 according to this embodiment, which has an organic light-emitting layer 5 made of a low-molecular organic light-emitting material, it is possible to implement an organic EL element which provides high element performances.

In addition, the organic EL element 10 configured like this is applicable to a display device. More specifically, it is possible to achieve an organic EL display device by forming the organic EL element 10 in each of a plurality of pixels arranged in a matrix. In this case, it is possible to achieve an organic EL display device which supports full-color representation by forming each of the organic light-emitting layers in the organic EL elements of the respective pixels using one of red, green, and blue organic light-emitting materials. It is to be noted that the organic EL display device may be driven using any one of a passive matrix driving method and an active matrix driving method.

Other Variations

Although the organic EL devices and the display device have been described above based on the embodiment, the techniques according to the present disclosure are not limited to the embodiment.

For example, in the above embodiment, the organic light-emitting layer 5 containing the low-molecular material is formed using the coating method, but the organic light-emitting layer 5 may be formed using a deposition method.

In the above embodiment, the first electrode 2 is formed using the sputtering method, the hole injection layer 3 is formed using the coating method or the sputtering method, and the electron transport layer 6, the electron injection layer 7, and the second electrode 8 are formed using the deposition method in the above embodiment, but these methods are non-limiting examples.

In addition, although the organic EL element is applicable to the display device in the above embodiment, the organic EL element 10 according to the embodiment is applicable to a light-emitting device other than the display device. For example, the organic EL element is applicable to a luminaire such as an organic EL lighting panel.

The present disclosure also covers embodiments which can be obtained by adding various kinds of modifications that a person skilled in the art may arrive at to the embodiment and embodiments which can be implemented by arbitrarily combining constituent elements and functions in the embodiment without deviating from the scope of the present disclosure.

INDUSTRIAL APPLICABILITY

The techniques according to the present disclosure are useful for organic EL devices and display devices, and are widely applicable to various light-emitting devices such as television receivers, monitor displays, digital signage, display devices including mobile terminals and tablet terminals, and lighting devices such as ceiling lights and indirect lighting.

The invention claimed is:

1. An organic electroluminescent (EL) element, comprising:
   a first electrode;
   a second electrode;
   an interlayer between the first electrode and the second electrode, the interlayer including at least one of a crosslinking group and an insolubilizing group and being formed via coating; and
   an organic light-emitting layer between the interlayer and the second electrode, the organic light-emitting layer being a blue light-emitting layer and being formed via coating; wherein:
   the organic light-emitting layer contains at least a host material and a dopant material, and a foundation of the organic light-emitting layer includes the interlayer;
   the interlayer is formed of a material which has an energy gap larger than an energy gap of the dopant material and a highest occupied molecular orbital (HOMO) level deeper than a HOMO level of the dopant material; and
   the interlayer includes arylamine, but does not include fluorene.

2. The organic EL element according to claim 1, wherein the host material and the dopant material are low-molecular materials.

3. The organic EL element according to claim 1, wherein the energy gap of the material used to form the interlayer is larger than an energy gap of the host material.

4. The organic EL element according to claim 3, wherein the energy gap of the material used to form the interlayer is 2.95 eV or more.

5. The organic EL element according to claim 3, wherein the energy gap of the material used to form the interlayer is 3.10 eV or more.

6. The organic EL element according to claim 3, wherein the HOMO level of the material used to form the interlayer is substantially equal to a HOMO level of the host material.

7. The organic EL element according to claim 1, wherein a material of the interlayer has a structural unit which includes arylamine but does not include fluorene, the structural unit being represented by Chemical formula 1, and

[Chemical formula 1]

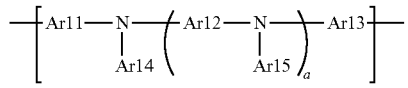

in Chemical formula 1, Ar11 to Ar15 each independently represent a same or different substituted or unsubstituted aromatic group, and a represent an integer ranging from 0 to 3.

8. The organic EL element according to claim 1, wherein a material of the interlayer has a structural unit which includes arylamine but does not include fluorene, the structural unit being represented by Chemical formula 2, and

[Chemical formula 2]

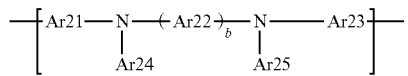

in Chemical formula 2, Ar21 to Ar25 each independently represent a same or different substituted or unsubstituted aromatic group, and b represent an integer ranging from 0 to 3.

19. The organic EL element according to claim 1, wherein a material of the interlayer has a structural unit which includes arylamine but does not include fluorene, the structural unit being represented by Chemical formula 3, and

[Chemical formula 3]

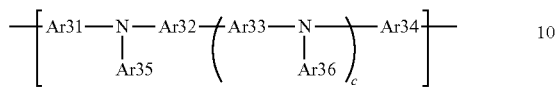

in Chemical formula 3, Ar31 to Ar36 each independently represent a same or different substituted or unsubstituted aromatic group, and c represent an integer ranging from 0 to 3.

10. The organic EL element according to claim 7, wherein the aromatic group includes a condensed polycyclic structure.

11. The organic EL element according to claim 7, wherein the aromatic group includes a heterocyclic structure.

12. The organic EL element according to claim 7, wherein the organic light-emitting layer is formed using a coating method.

13. A display device comprising the organic EL element according to claim 1.

14. The organic EL element according to claim 1, wherein the material of the interlayer is poly-TPD.

* * * * *